(12) United States Patent
Okunuki et al.

(10) Patent No.: US 7,189,979 B2
(45) Date of Patent: Mar. 13, 2007

(54) ELECTRON GUN

(75) Inventors: Masahiko Okunuki, Tokyo (JP); Hiroya Ohta, Kodaira (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 9 days.

(21) Appl. No.: 10/822,720

(22) Filed: Apr. 13, 2004

(65) Prior Publication Data

US 2004/0206919 A1 Oct. 21, 2004

(30) Foreign Application Priority Data

Apr. 21, 2003 (JP) .............................. 2003-116048

(51) Int. Cl.
*H01J 37/07* (2006.01)

(52) U.S. Cl. .............................. 250/492.2; 250/423 R; 250/398; 313/38

(58) Field of Classification Search ................ 250/492, 250/423, 398; 313/38
See application file for complete search history.

(56) References Cited

U.S. PATENT DOCUMENTS

| | | | | |
|---|---|---|---|---|
| 3,634,645 A | * | 1/1972 | Lempert et al. ............. | 250/398 |
| 4,199,689 A | * | 4/1980 | Takigawa .................. | 250/492.2 |
| 4,467,205 A | * | 8/1984 | Beisswenger et al. ...... | 250/397 |
| 4,812,662 A | | 3/1989 | Goto et al. ............... | 250/491.1 |
| 4,894,611 A | | 1/1990 | Shimoda et al. ........ | 324/158 R |
| 4,896,045 A | | 1/1990 | Okunuki et al. ......... | 250/492.2 |
| 4,897,552 A | | 1/1990 | Okunuki et al. ......... | 250/492.2 |
| 4,974,736 A | | 12/1990 | Okunuki et al. ....... | 219/121.12 |
| 5,136,171 A | * | 8/1992 | Leung et al. ............. | 250/492.2 |
| 5,633,507 A | * | 5/1997 | Pfeiffer et al. .......... | 250/492.23 |
| 5,854,490 A | * | 12/1998 | Ooaeh et al. ........... | 250/492.23 |
| 6,037,601 A | | 3/2000 | Okunuki ................. | 250/492.23 |
| 6,054,713 A | | 4/2000 | Miyake et al. .......... | 250/492.24 |
| 6,670,620 B1 | | 12/2003 | Okunuki .................. | 250/492.2 |
| 2003/0189180 A1 | * | 10/2003 | Hamaguchi et al. ..... | 250/492.3 |

FOREIGN PATENT DOCUMENTS

JP 2000-331632 11/2000

OTHER PUBLICATIONS

"soldering", Encyclopaedia Brittanica. Retrieved Jul. 12, 2005 from Encyclopaedia Brittanica Online. <http://www.search.eb.com/eb/article?tocld=9068572>.*

* cited by examiner

*Primary Examiner*—Jack I. Berman
(74) *Attorney, Agent, or Firm*—Fitzpatrick, Cella, Harper & Scinto

(57) ABSTRACT

An electron gun includes a cathode portion which emits electrons, an anode portion which accelerates the emission electrons, a bias portion which is arranged between the cathode portion and the anode portion and controls trajectories of the emission electrons, a shielding portion which is arranged below the anode portion and shields some of the emission electrons, and a cooling portion which cools the shielding portion. The bias portion controls the trajectories of the electrons so as to form a crossover between the bias portion and the anode portion, and prevents the electrons from emitting on the anode portion.

12 Claims, 11 Drawing Sheets

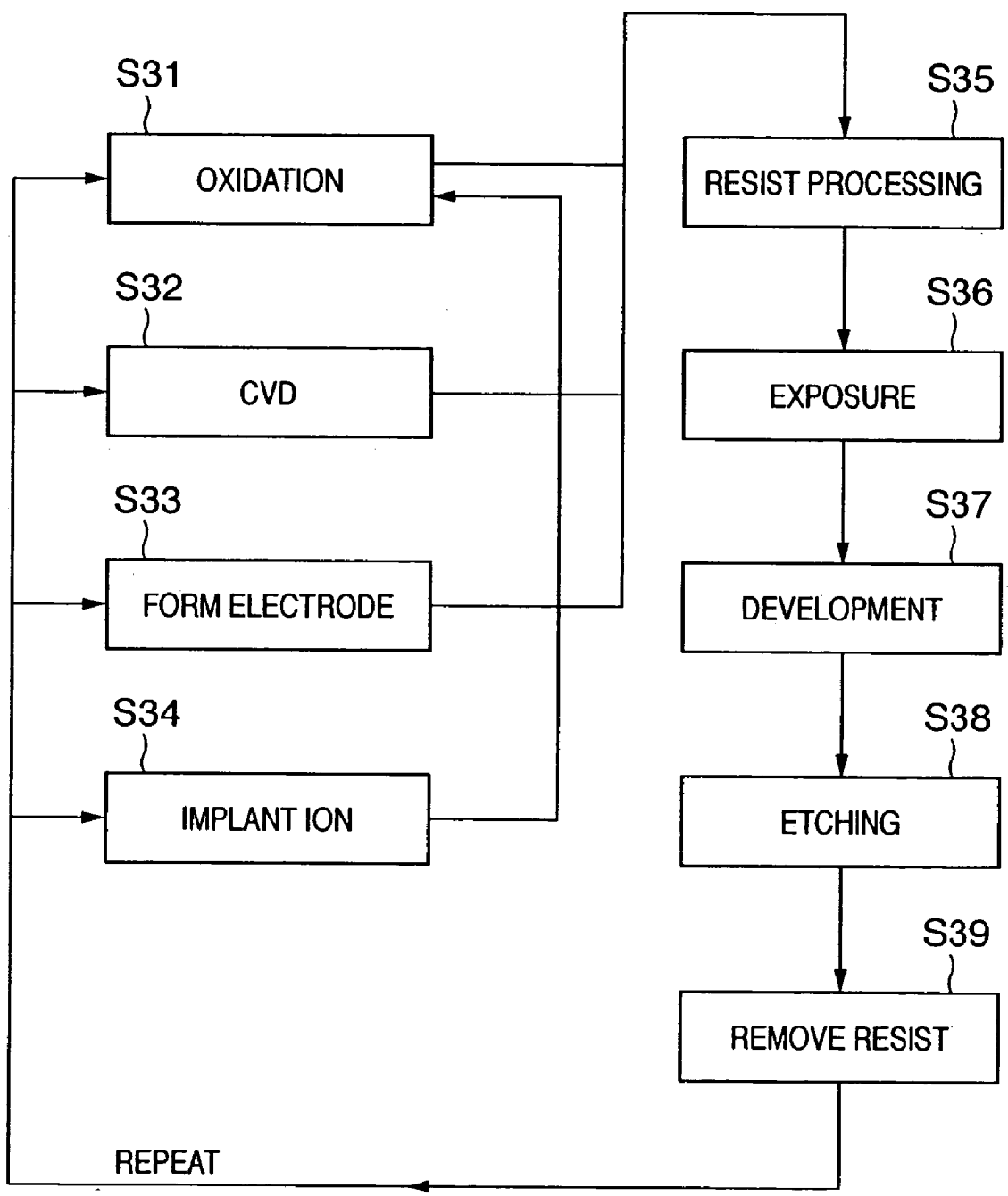

ELECTRON GUN

FIELD OF THE INVENTION

The present invention relates to an electron gun used in a lithography process in the manufacture of semiconductor devices, and exposure and image drawing technique using an electron gun.

BACKGROUND OF THE INVENTION

In the mass production stage of the manufacture of semiconductor devices, an optical stepper having high-productivity has been used. In the production of memory devices, for example, 4-G DRAMs and higher-capacity memory devices, having a linear width of 0.1 μm or less, an electron beam exposure method having high resolution and high productivity has been attracting attention as one of exposure techniques that replace an optical exposure method.

A conventional electron beam exposure method includes a single-beam Gaussian method and a variable forming method.

FIG. 9A shows the arrangement of an exposure apparatus that employs the conventional electron beam exposure method. An electron beam EB emitted from the top surface of a cathode electrode 201 passes through an aperture 202a of a bias electrode 202, forms a crossover CO between the bias electrode 202 and an anode electrode 203, passes through an anode electrode 203 and an aperture 204a integrally formed with the anode electrode 203 to become incident on the first and second illumination lenses 205a and 205b, and passes through an aperture 204b to become incident on a projection lens 207. After that, the electron beam EB is deflected by a deflector 208 and reaches a wafer 210. Reference numeral 211 denotes a stage which places the wafer 210 thereon and moves it.

In recent years, as a method of improving the productivity of the electron beam exposure method, a cell projection method has been proposed (e.g., see Japanese Patent Laid-Open No. 2000-331632). According to this method, the repeated circuit pattern portion of a memory device or the like is divided into several-μm regions, and the entire divided pattern regions are exposed at once. This method can improve the productivity. The line width accuracy is as important as the productivity. In order to ensure the line width accuracy, the irradiation strengths of the exposure regions must be uniform with a small difference of 1% or less throughout the entire exposure regions.

The area that can be exposed at once with the cell projection method is approximately 5 μm². The converging half-angle of the projection lens is set to several mrad in accordance with the resolution condition due to the lens aberration. Hence, as a condition required for uniform illumination, emittance $\epsilon$ defined by the product of the crossover diameter of the electron gun and the extracting half-angle of the irradiation beam must satisfy $\epsilon$>(exposure area×converging half-angle) (=~10 μm·mrad).

Regarding the type of the electron gun, an electron gun having a three-pole electron gun structure, which emits an electron beam with energy of about 50 kV, is generally used. To obtain a highly uniform beam from the emission electron beams emitted from the electron gun, a beam within a range of several mrad that provides good characteristics is selected from the emission electron beams emitted within an angular range of several ten mrad, and is used as the irradiation beam (for example, as shown in FIG. 9B, this beam is selected by using the aperture 204a).

This electron beam exposure apparatus uses a three-pole-structure electron gun which uses single-crystal boron hexafluoride ($LaB_6$) to form a cathode electrode. The emission current of the cathode electrode is 100 μA to 200 μA, and several μA are extracted from the beam current and are used as an electron beam that contributes to exposure. Hence, most of the emission current is shielded by a shielding electrode portion on the way. In the example of the conventional electron gun, as the total energy of the electron beam when the acceleration voltage is 50 kV is comparatively as small as 5 mW to 10 mW, substantially no heat is generated by shielding the electron beam. Therefore, most of the energy of the electron beam is dissipated in the column, and forced cooling is not accordingly performed.

As shown in FIG. 8, when brightness of 1.0 to $1.5 \times 10^6$ A/cm²sr and emittance of 15 to 30 rad μm·mrad are to be obtained as the characteristics of the electron gun that realize a high throughput, the current amount of the electron gun is derived by current=(brightness)×(emittance)². An emission current of about 10 times or more that of the conventional electron gun is required.

In the large-current-type electron gun satisfying the conditions of high brightness and large emittance in this manner, when the emission electrons generated by the cathode electrode 201 of the electron gun are shielded by the aperture 204a as in the conventional electron gun shown in FIG. 9A, the aperture 204a may dissolve. When the electrons are shielded by the anode electrode 203, the electrode portion may dissolve. When the emission electrons from the cathode electrode 201 do not irradiate the anode electrode 203 but are shielded in the column of the exposure apparatus, the scattering electrons from the shielding portion cause a charge-up phenomenon in the column. This degrades the position accuracy of the electron beam.

The electron gun is used with a high voltage of 50 kV or more. Therefore, the scattering electrons and secondary electrons generated when the emission electrons irradiate the anode electrode 203 scatter in the acceleration space of the electron gun. This causes weak discharge.

Therefore, it is difficult to realize a high-throughput electron beam exposure apparatus having a large-current-type electron gun that satisfies high brightness and large emittance.

SUMMARY OF THE INVENTION

The present invention has been made in view of the above problems, and has as its object to realize a temperature-stable electron gun by solving the problem of melting of the peripheral electrode caused by heat generation of the emission electrons, so that a high-brightness, high-throughput exposure apparatus is provided.

In order to solve the above problem and to achieve the above object, an electron gun according to the present invention comprises a cathode portion which emits electrons, an anode portion which accelerates the emission electrons, a bias portion which is arranged between the cathode portion and anode portion and controls trajectories of the emission electrons, a shielding portion which is arranged below the anode portion and shields some of the emission electrons, and a cooling portion which cools the shielding portion.

An electron beam exposure apparatus according to the present invention comprises an electron gun including a cathode portion which emits electrons, an anode portion which accelerates the emission electrons, a bias portion which is arranged between the cathode portion and anode portion and controls trajectories of the emission electrons, a shielding portion which is arranged below the anode portion and shields some of the emission electrons, and a cooling portion which cools the shielding portion, and a stage which moves in holding a substrate to be exposed by using the emission electrons.

A device manufacturing method according to the present invention comprises steps of exposing a substrate using the above-mentioned electron beam exposure apparatus, and developing the exposed substrate.

As described above, according to the present invention, in a high-brightness, large-emittance electron gun, since a cooling portion and a shielding portion which shields emission electrons are arranged, the problem of melting of the peripheral electrode caused by heat generation of the emission electrons is solved, so that the electron gun is stable in temperature. Thus, an electron beam exposure apparatus having high brightness and a high throughput performance can be realized.

As the emission electrons are shielded by the shielding portion, incidence of unwanted electrons inside a next-stage column can be suppressed. The problem of charging in the column can accordingly be solved. Hence, a stable, high-accuracy electron beam exposure apparatus in which fluctuation of the beam position by charging is small.

Since the heat problem is solved as described above, a large-current electron gun that satisfies high brightness and large emittance characteristics can be made compact. Also, the apparatus cost can be reduced.

Other features and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 11 is a flow chart for explaining the wafer process.

DETAILED DESCRIPTION OF THE PREFERRED EMBODIMENTS

Embodiments of an electron gun and exposure apparatus having the electron gun according to the present invention will be described in detail with reference to the accompanying drawings.

The present invention can be similarly applied, as an electron beam exposure apparatus that exemplifies the embodiment of the present invention, to an apparatus that irradiates a mask with an electron beam and projects and prints the mask pattern of the mask onto a wafer, an apparatus that draws an image on a wafer directly with one or a plurality of electron beams, an apparatus that draws a mask pattern on mask blanks with an electron beam, and the like.

Figure 7:
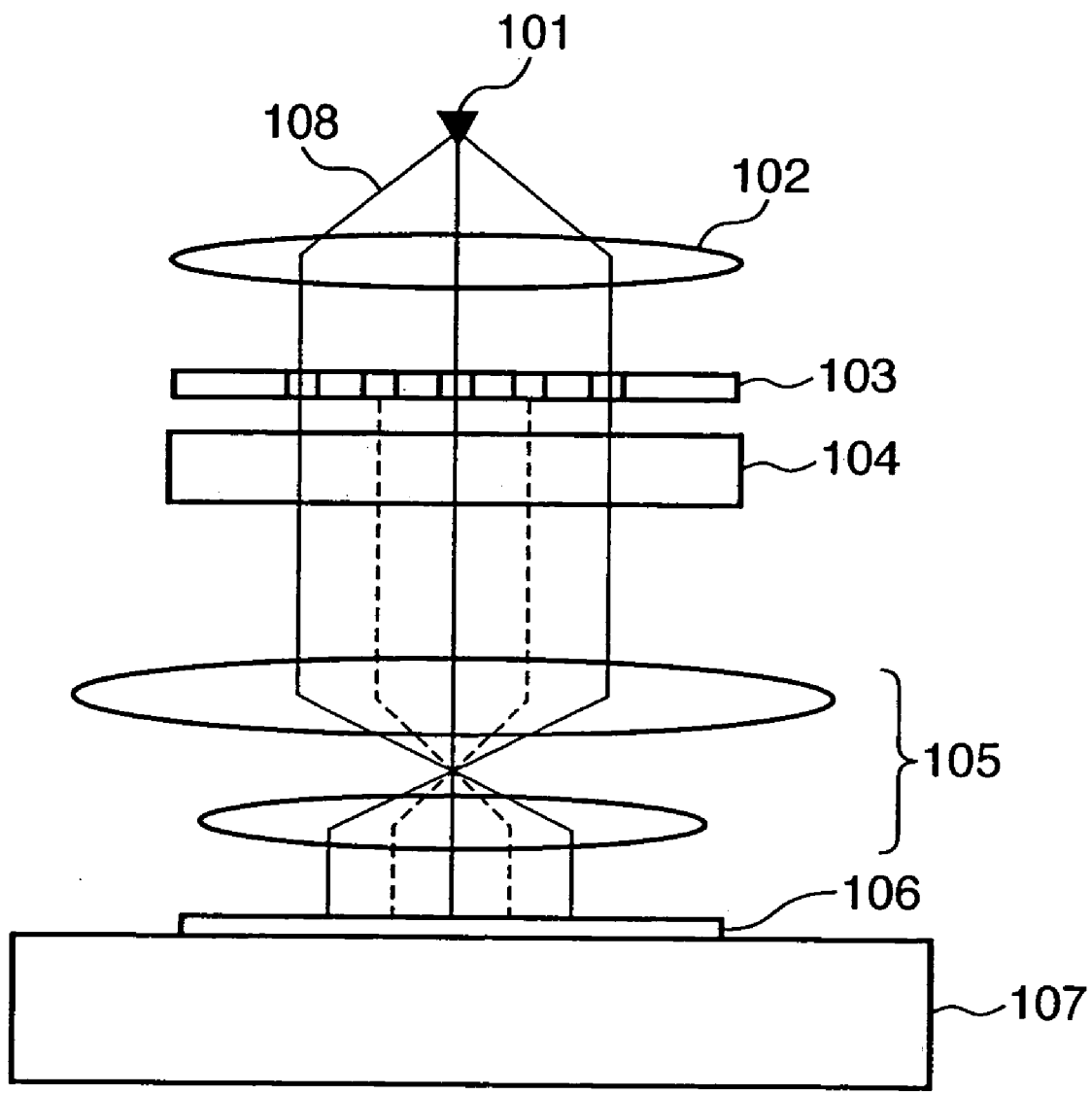
FIG. 7 is a view for explaining an example of the multibeam exposure method.
Figure 8:
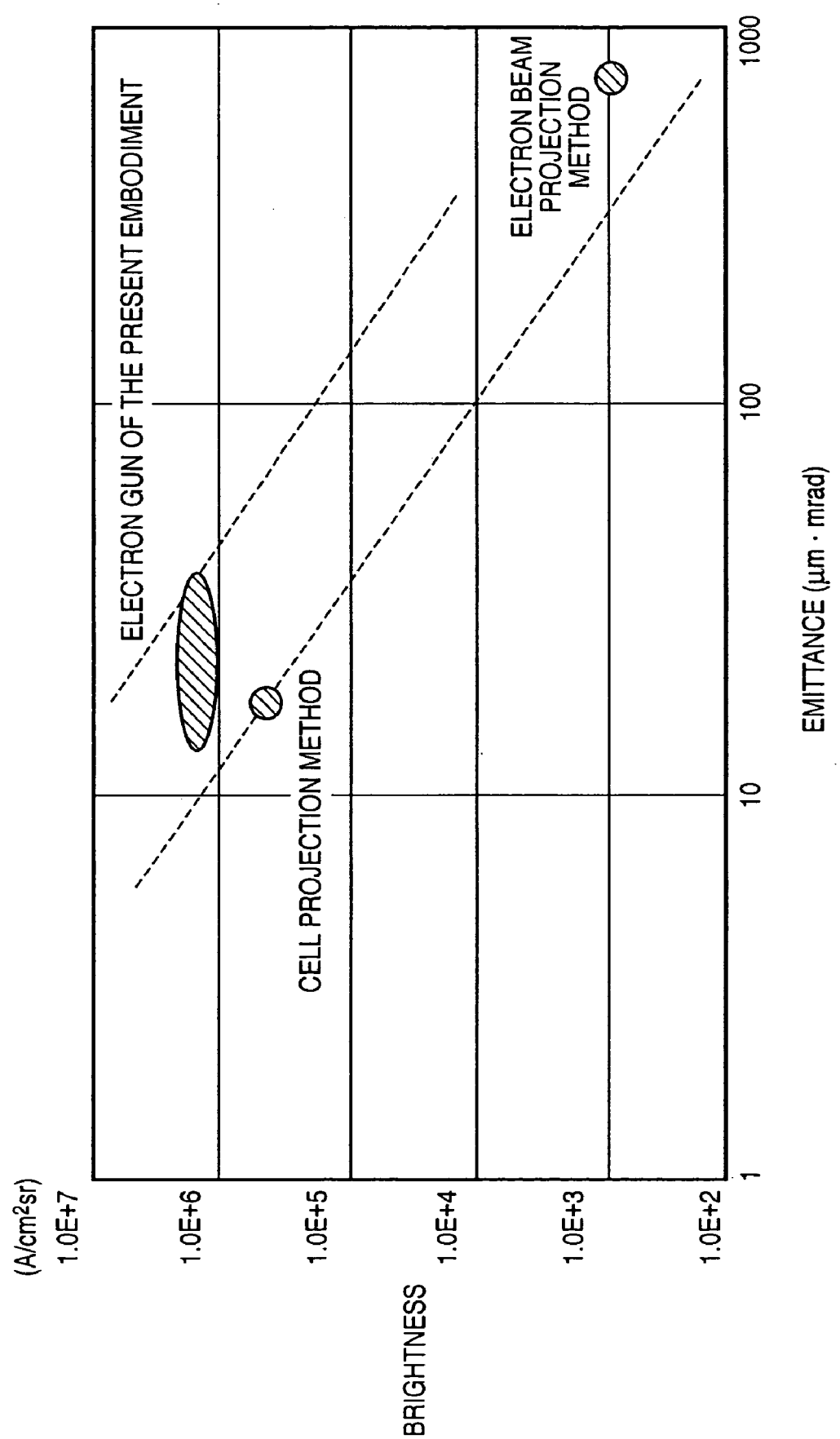
FIG. 8 is a graph for explaining the relationship between brightness and emittance.
Figure 9A:
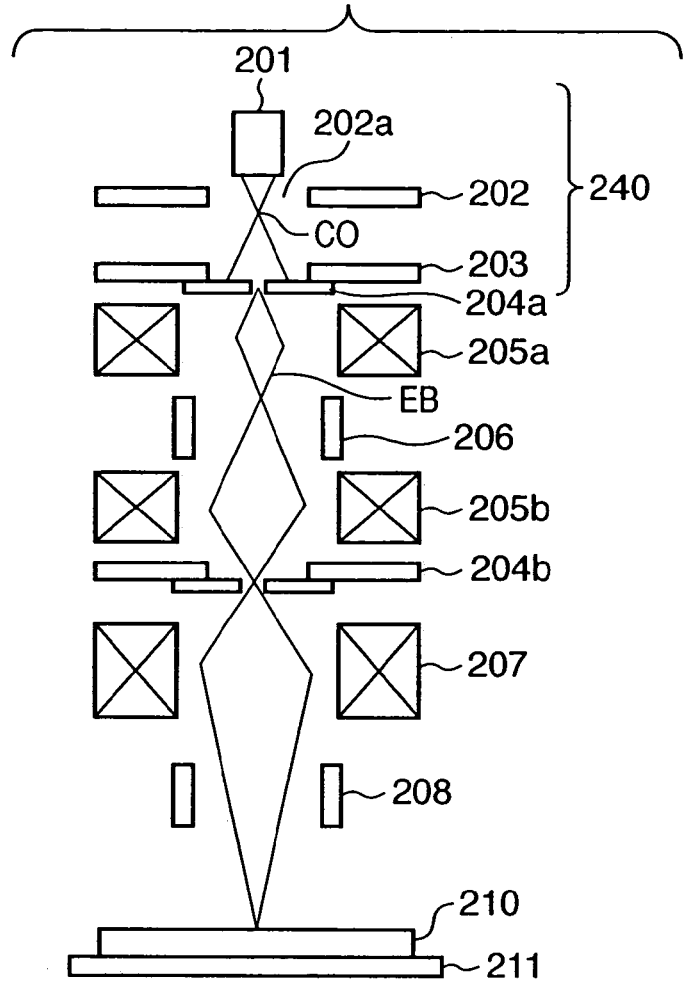
FIGS. 9A and 9B are a view and a graph, respectively, for explaining the relationship among the arrangement of a conventional electron beam exposure apparatus, the electron emission characteristics of the electron gun, and an irradiation beam region.
Figure 9B:
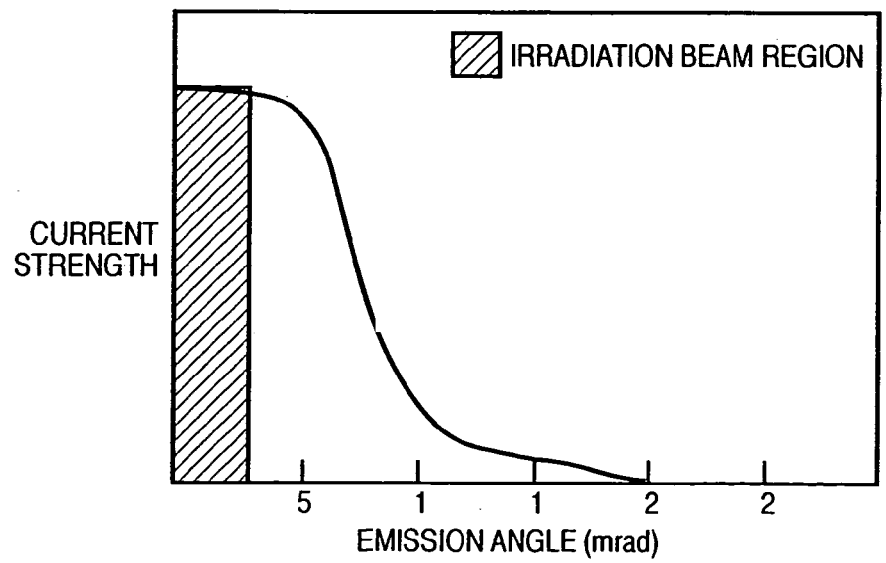

FIG. 7 shows an example of the multibeam method. An electron beam EB emitted from a single electron source 101 is collimated into parallel light by a condenser lens 102, and is divided into a plurality of beams by an aperture/blanker 103. After that, the lens aberration of a reduction lens 105 is corrected by an aberration-correcting multilens 104, and the electron beams are reduced by the reduction electron optical system 105 and irradiate a wafer 106. Reference numeral 107 denotes a stage which moves in holding the wafer 106.

According to this method, a plurality of intermediate images of the light source are formed in a direction perpendicular to the optical axis of the reduction electron optical system 105. Aberration, and particularly the curvature of field, which are generated when each intermediate image is reduced and projected onto the wafer 106 by the reduction electron optical system 105, can be corrected in advance. Thus, the image drawing region is expanded without degrading the resolution of the electron optical system, so that the productivity of the exposure apparatus can be increased.

Figure 1:
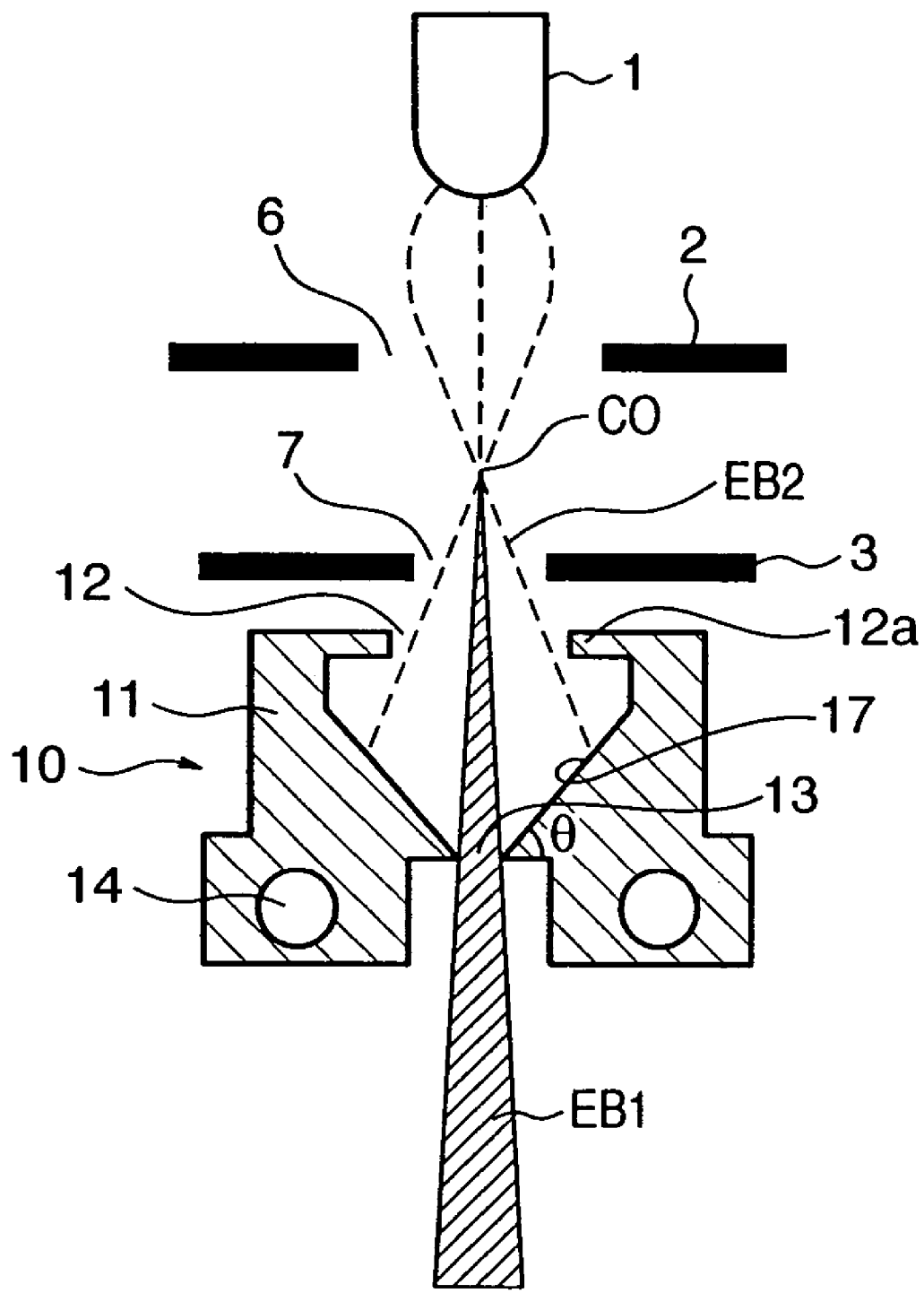
FIG. 1 is a schematic view showing the arrangement of an electron gun according to an embodiment of the present invention.

FIG. 1 shows the arrangement of an electron gun as a typical embodiment of the present invention that realizes high throughput as described above. The electron gun includes a cathode electrode 1, a bias electrode 2, an anode electrode 3, and a cooling unit 10 comprised of a shielding electrode 11 and a cooling portion 14. The cathode electrode 1 is made of boron hexafluoride ($LaB_6$), has a cathode temperature of 1,540° C., and is applied with a voltage of 50 kV. A voltage that matches the brightness characteristics is selected from a range of several hundred V to 1 kV, and is applied to the bias electrode 2. The top surface of the cathode electrode 1 is semispherical. Electrons emitted from the top surface of the cathode electrode 1 pass through the aperture 6 of the bias electrode 2, form a cross over CO between the bias electrode 2 and anode electrode 3, and further pass through an aperture 7 without irradiating the anode electrode 3, to become incident on the shielding electrode 11 after the aperture 7. The shielding electrode 11 has a structure for shielding an electron beam EB2 unnecessary for electron beam exposure. Only an electron beam EB1 to be used for exposing a wafer 106 passes through an aperture 13.

The shielding electrode 11 has an aperture 12 on which the electron beam EB2 becomes incident, and a tilt portion 17 to be irradiated by the electron beam EB2 becoming incident through the aperture 12. The tilt portion 17 forms a funnel-shaped surface (circular cone) tilting from a plane perpendicular to the optical axis by a predetermined angle θ (preferably 30°<θ<60°; substantially 45° in this embodiment), so that the electron beam EB2 unnecessary for electron beam exposure may become incident on the tilt portion 17 obliquely to a certain degree. This decreases the amount of the scattering electrons. Furthermore, the aperture 12 has a closing portion 12a which so shields the scattering electrons as to prevent or decrease the scattering electrons reflected by the tilt portion 17 from passing through the aperture 7 of the anode electrode 3 and becoming incident on the acceleration space (between the cathode electrode 1 and anode electrode 3) for the emission electrons. Therefore, of the electron beams emitted by the cathode electrode 1, the electron beam EB2 unnecessary for exposure is confined in the shielding electrode 11 under the anode electrode 3.

As an electron beam current necessary for achieving the high throughput performance, an emission current of 10 times or more that of the conventional electron gun is required. The total current must be 1 mA to several mA. As most of the electron beam is shielded by the shielding electrode 11, a quantity of heat of 50 W to several hundred W is supplied to the shielding electrode 11. The shielding electrode 11 is integral with the cooling portion 14 which is cooled with cooling water. Thus, temperature rise of the shielding electrode 11 is prevented (or decreased), the problem of melting is solved, and also heat generation by the peripheral components of the cooling unit 10 is prevented.

Figure 2:
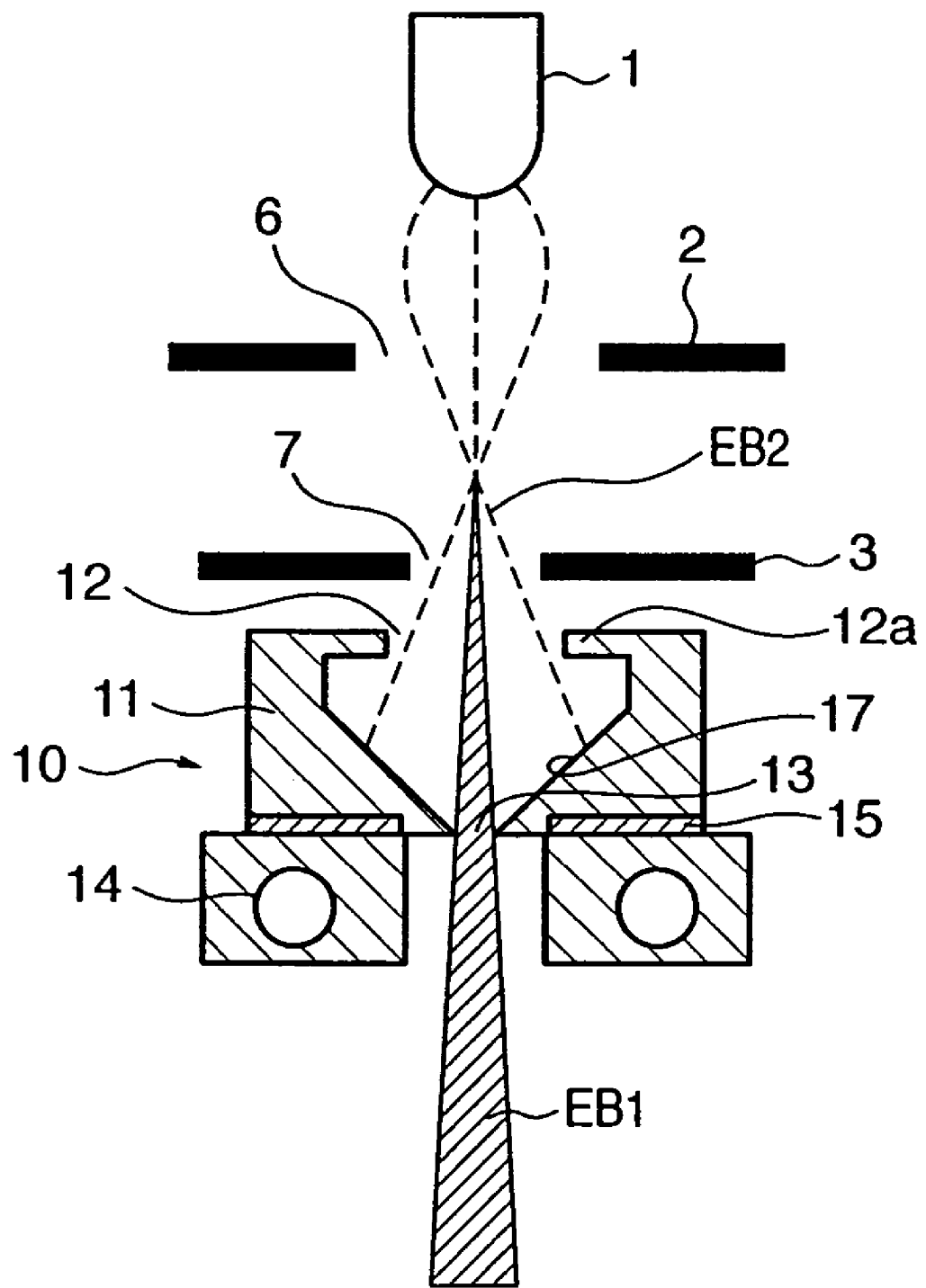
FIG. 2 is a schematic view showing the arrangement of an electron gun according to an embodiment of the present invention, in which a cooling unit is separable.

FIG. 2 shows an example in which a shielding electrode 11 and cooling portion 14 are separably formed. To form the shielding electrode 11, a high-melting material such as W, Mo, or Ta can be used. Alternatively, a material made of a light element (e.g., graphite or boron nitride) having low scattering efficiency against incident electrons may be selected. To form the cooling portion 14, a metal material having high thermal conductivity such as Cu, Al, Fe, or Ti is used. Heat resistance occurs at a contact portion 15 of the shielding electrode 11 and cooling portion 14, making it difficult to cool the shielding electrode 11 efficiently. In view of this, a metal material (e.g., In, Ga, Pb, or a low-melting alloy) having a lower melting point than that of the shielding electrode 11 is interposed before the contact portion 15, so that the heat resistance is decreased, and that the cooling efficiency of the shielding electrode 11 is increased accordingly. Apart from this, the same elements as in FIG. 1 are denoted by the same reference numerals, and a description thereof will be omitted.

Figure 3:
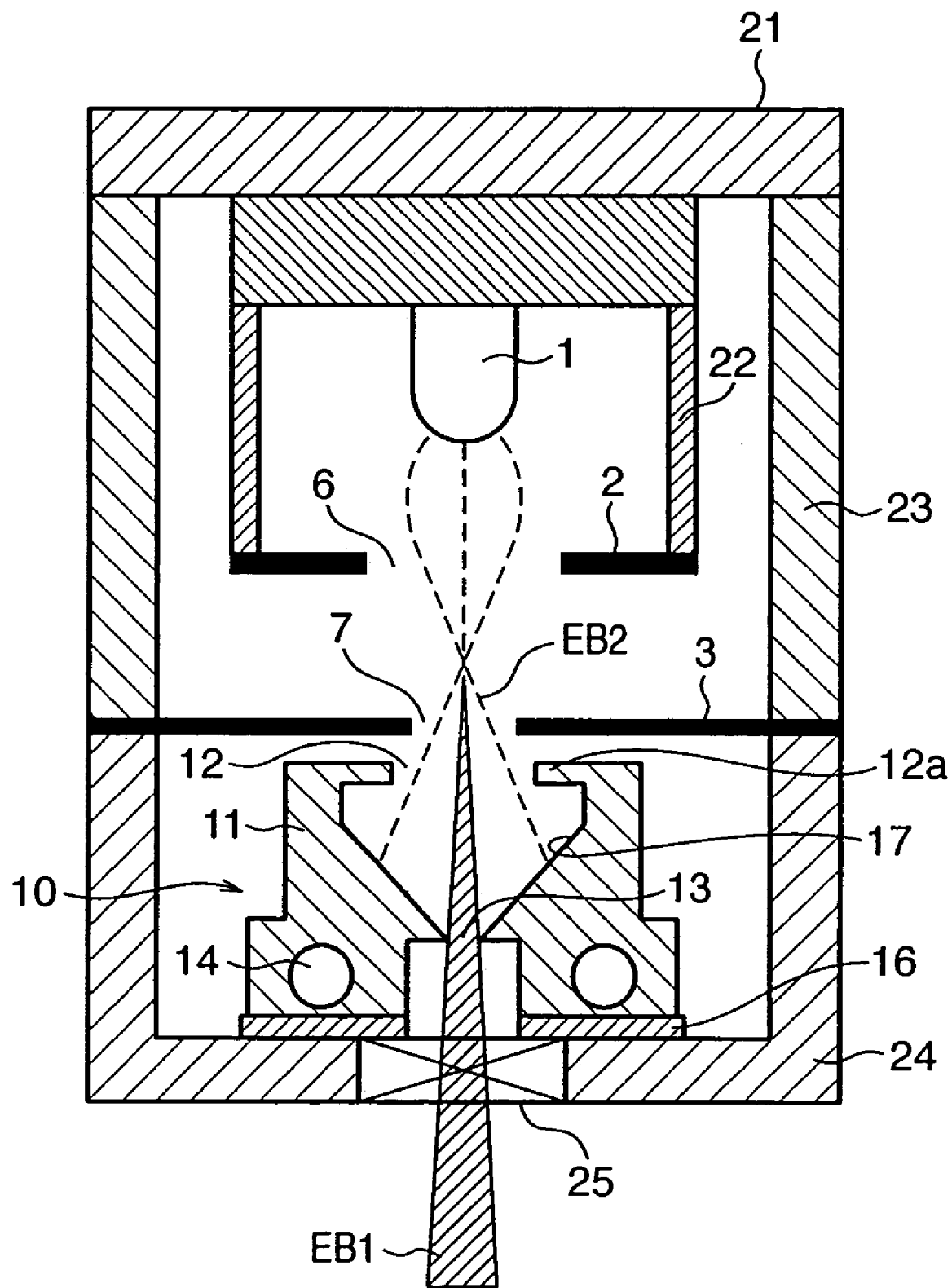
FIG. 3 is a schematic view showing the arrangement of an electron gun according to an embodiment of the present invention, in which a cooling unit is arranged in a chamber.

FIG. 3 shows the arrangement of a chamber that houses the electron gun. Even when the electron gun is arranged in a chamber 24 in this manner, a cooling unit 10 having a shielding electrode 11 and cooling portion 14 confines an electron beam EB2 in a narrow shielded space, as described above. Only an electron beam EB1 effective for electron beam exposure can emerge outside the chamber 24 through an aperture 13 and valve 25. Thus, the chamber 24 can be made compact. Apart from this, the same elements as in FIG. 1 are denoted by the same reference numerals, and a description thereof will be omitted.

Figure 4:
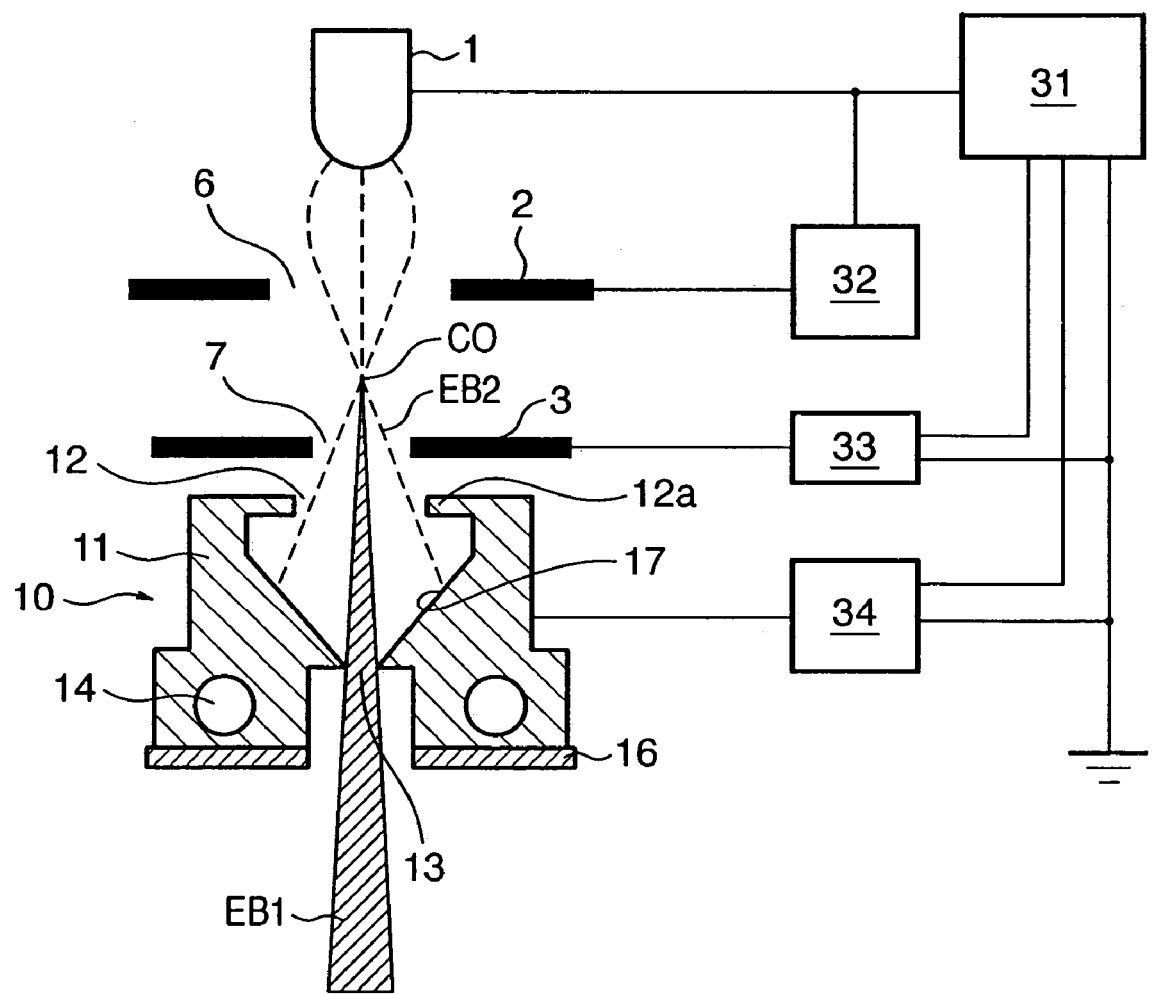
FIG. 4 is a schematic view, including a control block, of an electron gun according to an embodiment of the present invention.

FIG. 4 shows an arrangement in which an insulator 16 is arranged under a cooling portion 14, and insulating pure water or Freon® is used as a cooling medium that cools the cooling portion 14. The current which becomes incident on a shielding electrode 11 can be detected by a current detector 34. The amount of electrons becoming incident on an anode electrode 3 can be detected by a current detector 33.

A high-voltage generator 31 and bias voltage generator 32 apply predetermined voltages to a cathode electrode 1 and bias electrode 2, respectively. In order to avoid melting of the anode electrode 3, the operations of the high-voltage generator 31 and bias voltage generator 32 are controlled on the basis of the detection results of the current detectors 33 and 34. When abnormalities occurring depending on the adjustment of the electron gun and the attaching position of the cathode, or due to irradiation with an inappropriate bias voltage are detected by using the current detectors 33 and 34, the high-voltage generator 31 can be operated safely. Apart from this, the same elements as in FIG. 1 are denoted by the same reference numerals, and a description thereof will be omitted.

Figure 5:
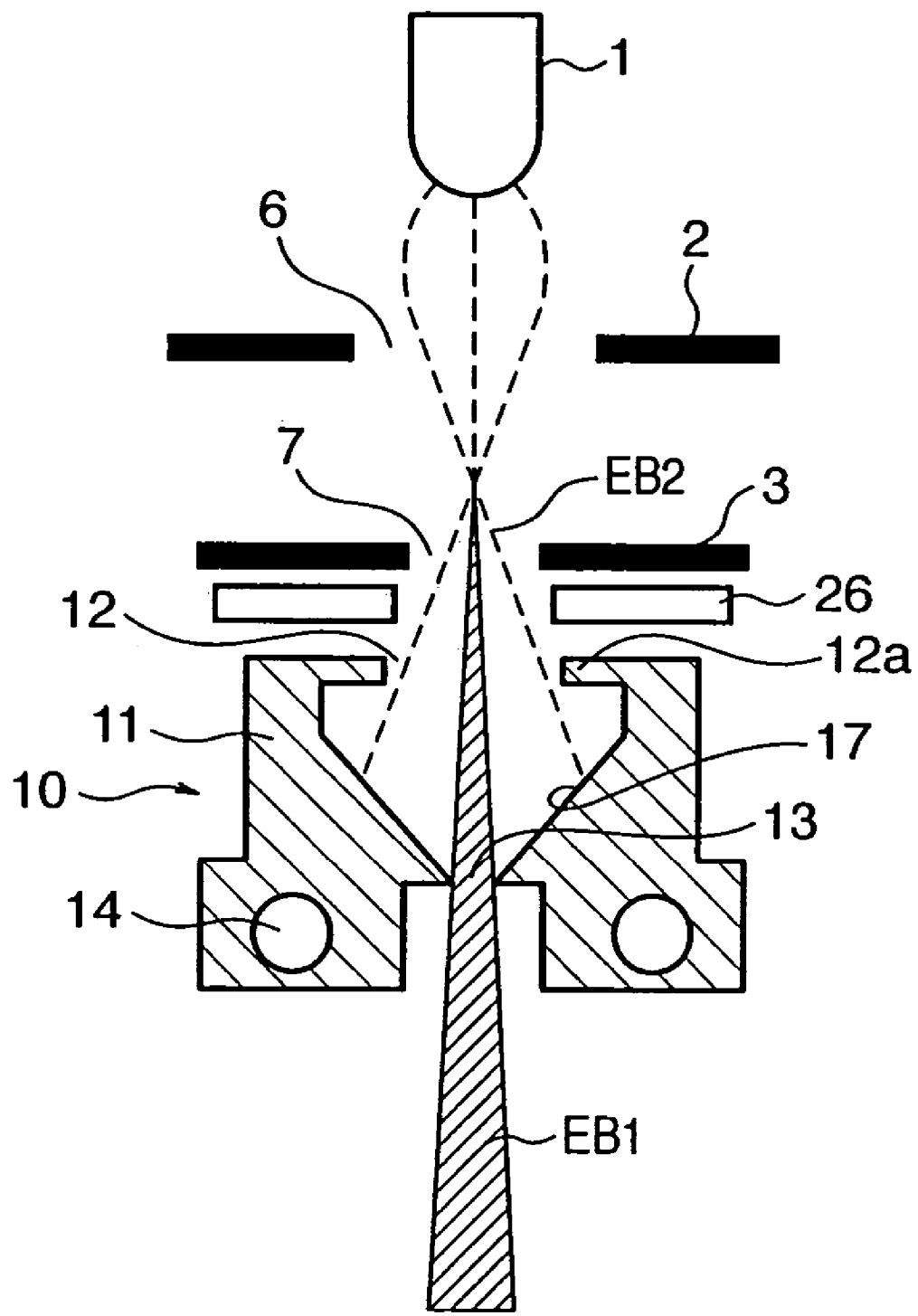
FIG. 5 is a schematic view showing the arrangement of an electron gun according to an embodiment of the present invention, in which scattering electrons are suppressed.

FIG. 5 shows a structure for further decreasing the secondary electrons and scattering electrons scattering from a cooling unit 10. An electrode 26 is provided between an anode electrode 3 and shielding electrode 11. Electrons leaking from an aperture 12 of the shielding electrode 11 can improve the shielding effect because of the electrode 26 to which a negative voltage is applied. Apart from this, the same elements as in FIG. 1 are denoted by the same reference numerals, and a description thereof will be omitted.

Figure 6:
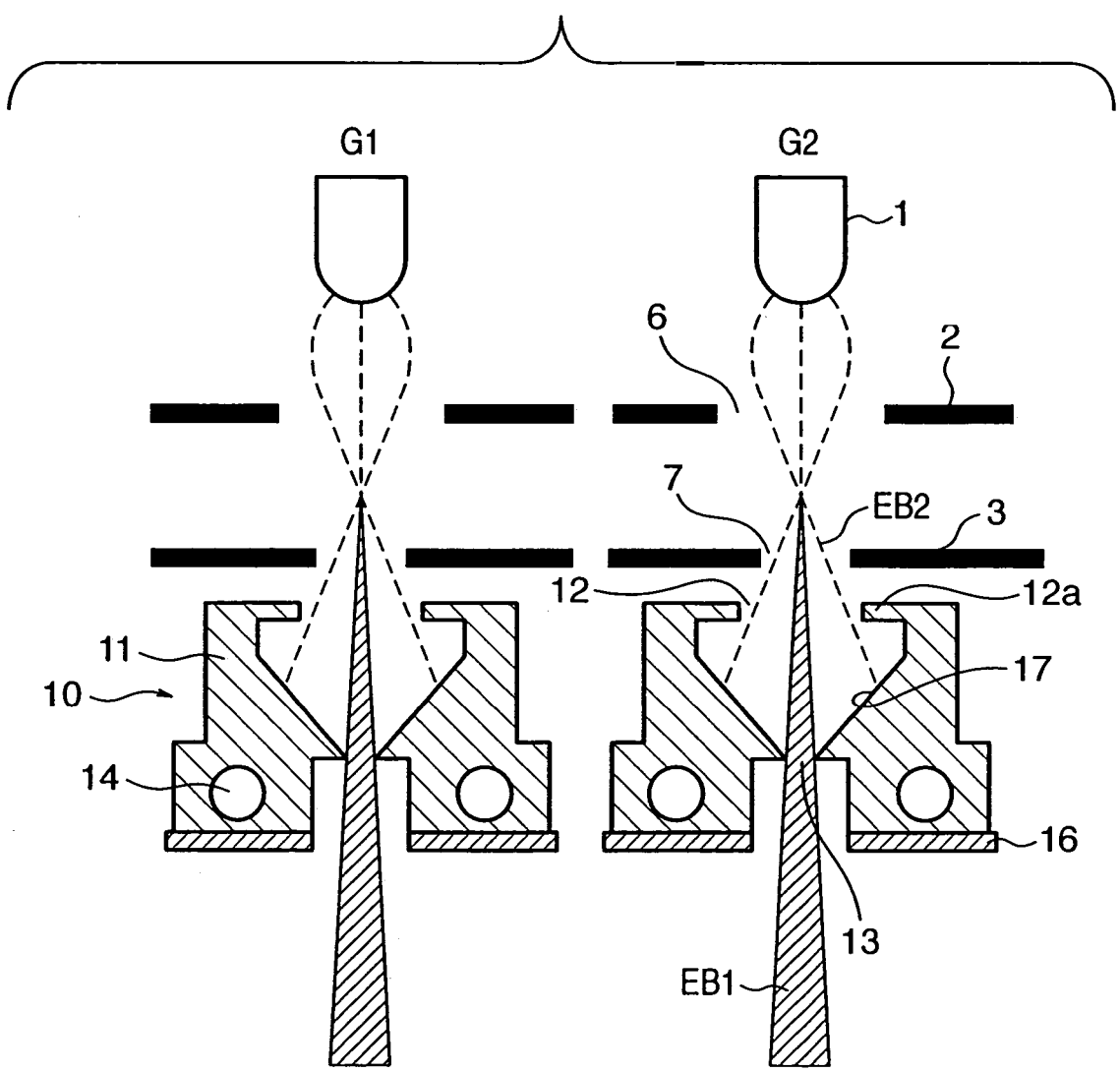
FIG. 6 is a schematic view showing an arrangement in which a plurality of electron guns according to an embodiment of the present invention are arrayed.

FIG. 6 shows an arrangement (electron guns G1 and G2 in this case) in which a plurality of (multiple of) electron guns each having a cooling unit 10 identical to that described above are arrayed. Emission electrons emitted from the array of a plurality of cathode electrodes 1 are shielded and cooled by respective cooling units 10, so that the problem of heat generation of the array of the plurality of electron guns can be solved. Thus, the entire structure can be made compact. Shielding electrodes 11 are arranged in the respective cooling units 10 independently of each other. The currents of the shielding electrodes 11 can be detected independently of each other by the current detectors 33 shown in FIG. 4. The high-voltage generator 31 and bias voltage generator 32 shown in FIG. 4 are controlled independently of each other. Then, the emission currents from the respective cathode electrodes 1 can be stabilized.

According to the above embodiments, in the electron gun having the cooling unit 10, unnecessary electrons are shielded and cooled by the shielding electrode 11. Heat generated in the electron gun is not transmitted to the column main body, so that a temperature-stable column can be formed. Also, since electrons necessary for electron beam exposure become incident on the column, electrification caused by unnecessary electrons can be decreased. Therefore, a stable, high-speed electron beam exposure apparatus can be realized.

When the present invention is applied to a multicolumn-type electron beam exposure apparatus having a plurality of electron guns, an electron beam exposure apparatus having higher-throughput performance can be realized.

[Device Manufacturing Method]

A device manufacturing method using the above-mentioned semiconductor manufacturing apparatus will be described.

Figure 10:
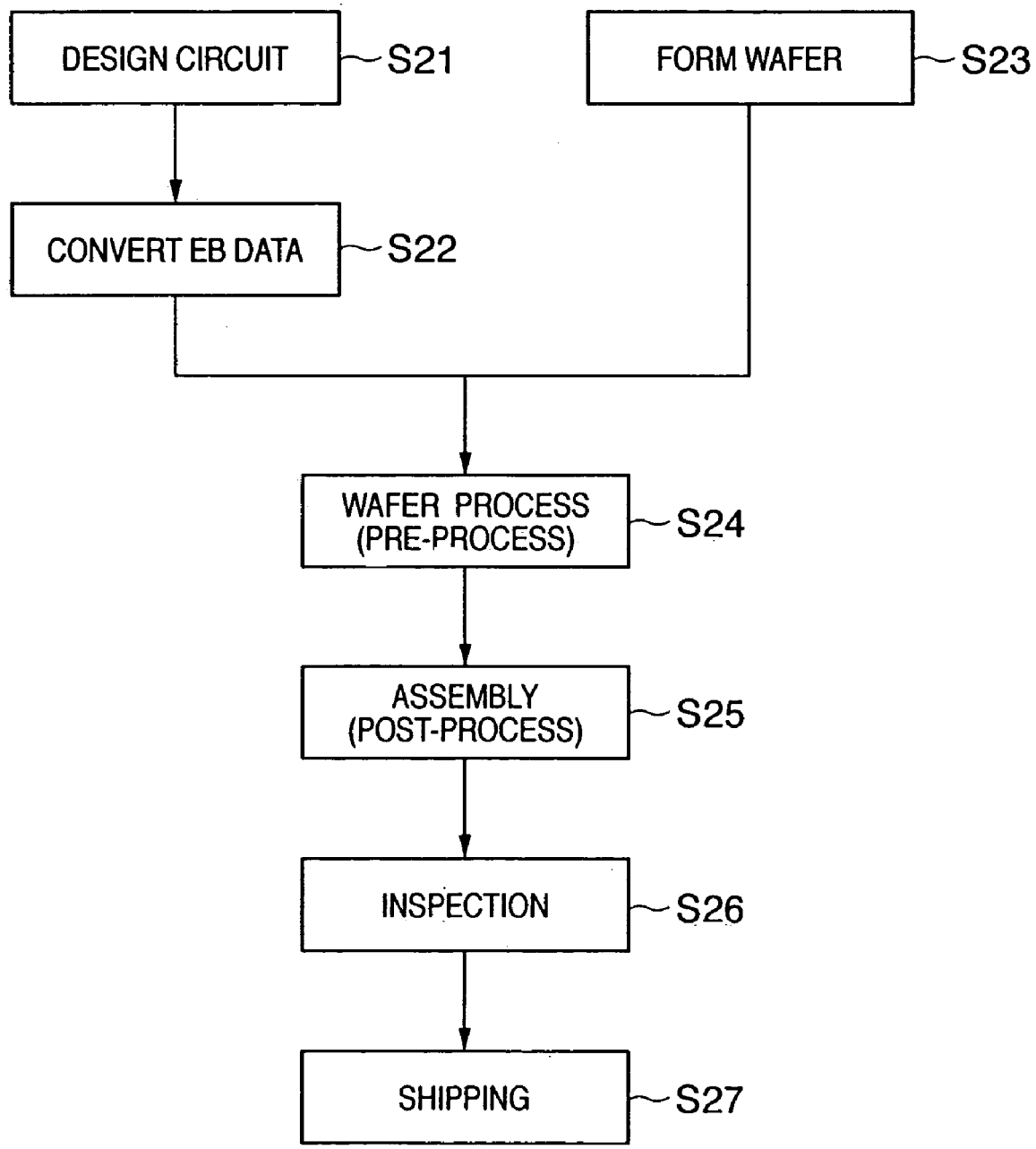
FIG. 10 is a flow chart for explaining the flow of the manufacture of a semiconductor device.

FIG. 10 shows the flow of the manufacture of a microdevice (e.g., a semiconductor chip such as an IC or LSI, a liquid crystal panel, a CCD, a thin-film magnetic head, or a micromachine). In step S21 (circuit design), a semiconductor device circuit is designed. In step S22 (exposure control data creation), exposure control data for an exposure apparatus is created on the basis of the designed circuit pattern. In step S23 (wafer manufacture), a wafer is manufactured by using a material such as silicon. In step S24 (wafer process), called a preprocess, an actual circuit is formed on the wafer by lithography using the wafer and the exposure apparatus, into which the prepared exposure control data is entered onto the mask. Step S25 (assembly), called a post-process, is the step of forming a semiconductor chip by using the wafer formed in step S24, and includes an assembly process (dicing and bonding) and a packaging process (chip encapsulation). In step S26 (inspection), the semiconductor device manufactured in step S25 undergoes inspections such as an operation confirmation test and a durability test. After these steps, the semiconductor device is completed and shipped (step S27).

FIG. 11 shows the detailed flow of the above-mentioned wafer process. In step S31 (oxidation), the wafer surface is oxidized. In step S32 (CVD), an insulating film is formed on the wafer surface. In step S33 (electrode formation), an electrode is formed on the wafer by vapor deposition. In step S34 (ion implantation), ions are implanted in the wafer. In step S35 (resist processing), a photosensitive agent is applied to the wafer. In step S36 (exposure), the circuit pattern is printed onto the wafer by exposure using the above-mentioned exposure apparatus. In step S37 (development), the exposed wafer is developed. In step S38 (etching), the resist is etched except for the developed resist image. In step S39 (resist removal), an unnecessary resist after etching is removed. These steps are repeated to form multiple circuit patterns on the wafer.

The device manufacturing method of this embodiment can manufacture, at low cost, a highly integrated semiconductor device, which is hard to manufacture by a conventional method.

As many apparently widely different embodiments of the present invention can be made without departing from the spirit and scope thereof, it is to be understood that the invention is not limited to the specific embodiments thereof except as defined in the appended claims.

What is claimed is:

1. An electron gun comprising:
   a cathode portion which emits electrons;
   an anode portion which has an aperture and accelerates the emission electrons;
   a bias portion which is arranged between said cathode portion and said anode portion and controls trajectories of the emission electrons so as to form a crossover between the bias portion and the anode portion so that the electrons do not strike the anode portion; and
   a shielding portion disposed below said anode portion for shielding some of the emission electrons and having a cooling portion which cools said shielding portion, said cooling portion being disposed at the lower part of the shielding portion,
   wherein said shielding portion includes a tilt portion tilting with respect to an incident direction of the emission electrons and includes a closing portion located between the tilt portion and the anode portion for inhibiting the electrons reflected by the tilt portion from passing through the aperture of the anode portion.

2. The gun according to claim 1, wherein a top surface of said cathode portion is formed of a hemisphere or a hemispherical member.

3. The gun according to claim 1, wherein said shielding portion and said cooling portion are integral.

4. The gun according to claim 1, wherein said shielding portion and said cooling portion are separable, said shielding portion is made of a high melting material, and a low melting material is interposed between said shielding portion and said cooling portion.

5. The gun according to claim 1, wherein said cooling portion includes an insulator, and a cooling medium having a predetermined resistance is passed through said cooling portion.

6. The gun according to claim 5, further comprising a detecting portion which detects the electrons becoming incident on said shielding portion, and a control portion which controls an application voltage on the basis of a detection result of said detecting portion.

7. The gun according to claim 1, wherein an electrode is provided between said anode portion and said shielding portion, and a voltage is applied to said electrode.

8. The gun according to claim 1, wherein said electron gun comprises a plurality of electron guns arrayed in a single chamber.

9. The gun according to claim 8, wherein said plurality of arrayed electron guns respectively include detecting portions each of which detects the electrons becoming incident on said shielding portion, and control portions each of which controls an application voltage on the basis of a detection result of said detecting portion, said control portions being controlled independently of each other.

10. An exposure apparatus comprising:
    an electron gun according to claim 1, wherein said electron gun exposes a substrate with an electron beam emitted from said electron gun.

11. An electron beam exposure apparatus comprising:
    an electron gun including a cathode portion which emits electrons, an anode portion which has an aperture and accelerates the emission electrons, a bias portion which is arranged between said cathode portion and said anode portion and controls trajectories of the emission electrons so as to form a crossover between the bias portion and the anode portion, so that the electrons do not strike the anode portion, a shielding portion disposed below said anode portion for shielding some of the emission electrons, and having a cooling portion which cools said shielding portion, said cooling portion being disposed at the lower part of said shielding portion; and
    a stage which moves in holding a substrate to be exposed by using the emission electrons,
    wherein said shielding portion includes a tilt portion tilting with respect to an incident direction of the emission electrons, and includes a closing portion located between the tilt portion and the anode portion for inhibiting the electrons reflected by the tilt portion from passing through the aperture of the anode portion.

12. A device manufacturing method comprising the steps of:
    exposing a substrate using an electron beam exposure apparatus according to claim 11; and
    developing the exposed substrate.

* * * * *